United States Patent
Kaufman, Jr.

(10) Patent No.: US 8,219,595 B2
(45) Date of Patent: Jul. 10, 2012

(54) SYSTEM AND METHOD FOR EFFICIENT REMOTE DATA ACCESS FOR SERVER MANAGEMENT

(75) Inventor: Gerald J. Kaufman, Jr., Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 780 days.

(21) Appl. No.: 12/234,764

(22) Filed: Sep. 22, 2008

(65) Prior Publication Data

US 2009/0210401 A1 Aug. 20, 2009

Related U.S. Application Data

(60) Provisional application No. 61/064,060, filed on Feb. 14, 2008.

(51) Int. Cl.
*G06F 17/30* (2006.01)

(52) U.S. Cl. ......... 707/803; 707/804; 707/805; 707/806

(58) Field of Classification Search .................. 707/713, 707/714, 715, 716, 717, 718, 719, 803, 804, 707/805, 806

See application file for complete search history.

(56) References Cited

U.S. PATENT DOCUMENTS

| | | | |
|---|---|---|---|
| 4,493,083 A | 1/1985 | Kinoshita |
| 5,084,816 A | 1/1992 | Boese et al. |
| 5,261,055 A | 11/1993 | Moran et al. |
| 5,442,771 A | 8/1995 | Filepp et al. |
| 5,479,637 A | 12/1995 | Lisimaque et al. |
| 5,535,357 A | 7/1996 | Moran et al. |
| 5,579,522 A | 11/1996 | Christeson et al. |
| 5,596,738 A | 1/1997 | Pope |
| 5,598,534 A | 1/1997 | Haas |
| 5,608,910 A | 3/1997 | Shimakura |
| 5,622,954 A | 4/1997 | Henrie, II et al. |
| 5,628,016 A | 5/1997 | Kukol |
| 5,666,293 A | 9/1997 | Metz et al. |
| 5,752,039 A | 5/1998 | Tanimura |
| 5,778,440 A | 7/1998 | Yiu et al. |
| 5,790,974 A | 8/1998 | Tognazzini |
| 5,832,000 A | 11/1998 | Lin et al. |
| 5,832,520 A | 11/1998 | Miller |
| 5,878,256 A | 3/1999 | Bealkowski et al. |
| 5,896,566 A | 4/1999 | Averbuch et al. |
| 5,960,445 A | 9/1999 | Tamori et al. |

(Continued)

OTHER PUBLICATIONS

Baker, et al, "Compressing Differences of Executable Code", Apr. 22, 1999.

(Continued)

*Primary Examiner* — Shahid Alam
*Assistant Examiner* — Jagdish Pandya

(57) ABSTRACT

A system and method for efficient data access are described. A method for efficient remote data access for use by server management applications, includes transferring server schema from a service processor on a server to an application machine, receiving a request for server data on application machine, processing the request for server data on application machine, and forming, in a self-describing format, a single, consolidated query to obtain information not obtained from the server schema on the application machine. Processing the request obtains server data from the server schema on the application machine and the consolidated query is formatted in self-describing format. The method further includes transferring the consolidated query to the service processor, the service processor: processing the consolidated query, obtaining the requested data, and forming a response with the requested data in the self-describing format. The method transmits the formatted, retrieved data to application machine.

17 Claims, 2 Drawing Sheets

U.S. PATENT DOCUMENTS

| | | | |
|---|---|---|---|
| 5,968,182 | A | 10/1999 | Chen et al. |
| 5,974,250 | A | 10/1999 | Angelo et al. |
| 6,009,497 | A | 12/1999 | Wells et al. |
| 6,018,747 | A | 1/2000 | Burns et al. |
| 6,038,636 | A | 3/2000 | Brown, III et al. |
| 6,064,814 | A | 5/2000 | Capriles et al. |
| 6,073,206 | A | 6/2000 | Piwonka et al. |
| 6,073,214 | A | 6/2000 | Fawcett |
| 6,088,759 | A | 7/2000 | Hasbun et al. |
| 6,105,063 | A | 8/2000 | Hayes, Jr. |
| 6,112,024 | A | 8/2000 | Almond et al. |
| 6,112,197 | A | 8/2000 | Chatterjee et al. |
| 6,126,327 | A | 10/2000 | Bi et al. |
| 6,128,695 | A | 10/2000 | Estakhri et al. |
| 6,138,249 | A | 10/2000 | Nolet |
| 6,157,559 | A | 12/2000 | Yoo |
| 6,163,274 | A | 12/2000 | Lindgren |
| 6,198,946 | B1 | 3/2001 | Shin et al. |
| 6,212,659 | B1 | 4/2001 | Zehavi |
| 6,279,153 | B1 | 8/2001 | Bi et al. |
| 6,311,322 | B1 | 10/2001 | Ikeda et al. |
| 6,301,710 | B1 | 1/2002 | Ozawa et al. |
| 6,381,740 | B1 | 4/2002 | Miller et al. |
| 6,408,434 | B1 | 6/2002 | Fujiwara |
| 6,209,111 | B1 | 8/2002 | Morie et al. |
| 6,438,585 | B2 | 8/2002 | Capriles et al. |
| 6,526,574 | B1 | 2/2003 | Jones |
| 6,546,552 | B1 | 4/2003 | Peleg |
| 6,591,272 | B1 * | 7/2003 | Williams ........................... 1/1 |
| 6,615,038 | B1 | 9/2003 | Moles et al. |
| 6,615,404 | B1 | 9/2003 | Garfunkel et al. |
| 6,659,345 | B2 | 12/2003 | Sukeda et al. |
| 6,668,336 | B2 | 12/2003 | Lasser |
| 6,675,382 | B1 | 1/2004 | Foster |
| 6,725,056 | B1 | 4/2004 | Moles et al. |
| 6,725,392 | B1 | 4/2004 | Frey et al. |
| 6,728,950 | B2 | 4/2004 | Davis et al. |
| 6,832,373 | B2 | 12/2004 | O'Neill |
| 6,836,657 | B2 | 12/2004 | Ji et al. |
| 6,925,467 | B2 | 8/2005 | Gu et al. |
| 6,928,108 | B2 | 8/2005 | Nelson et al. |
| 6,968,543 | B2 | 11/2005 | Takahara et al. |
| 7,031,972 | B2 | 4/2006 | Ren et al. |
| 7,069,545 | B2 | 6/2006 | Wang et al. |
| 7,073,017 | B2 | 7/2006 | Yamamoto |
| 7,143,115 | B2 | 11/2006 | Jones et al. |
| 7,242,929 | B2 | 7/2007 | Draluk et al. |
| 7,275,243 | B2 | 9/2007 | Gibbons et al. |
| 7,292,846 | B2 | 11/2007 | Mittal |
| 7,313,791 | B1 | 12/2007 | Chen et al. |
| 7,367,027 | B1 | 4/2008 | Chen et al. |
| 7,369,851 | B2 | 5/2008 | Okkonen et al. |
| 7,433,936 | B2 | 10/2008 | Zhu et al. |
| 7,555,750 | B1 | 6/2009 | Lilley |
| 7,818,556 | B2 | 10/2010 | Lima et al. |
| 2001/0029178 | A1 | 10/2001 | Criss et al. |
| 2001/0047363 | A1 | 11/2001 | Peng |
| 2001/0048728 | A1 | 12/2001 | Peng |
| 2002/0065919 | A1 * | 5/2002 | Taylor et al. .................. 709/226 |
| 2002/0072359 | A1 | 6/2002 | Moles et al. |
| 2002/0078209 | A1 | 6/2002 | Peng |
| 2002/0116261 | A1 | 8/2002 | Moskowitz et al. |
| 2002/0131404 | A1 | 9/2002 | Mehta et al. |
| 2002/0152005 | A1 | 10/2002 | Bagnordi |
| 2002/0156863 | A1 | 10/2002 | Peng |
| 2003/0023964 | A1 | 1/2003 | Rajaram et al. |
| 2003/0027563 | A1 | 2/2003 | Herle et al. |
| 2003/0033590 | A1 | 2/2003 | Leherbauer |
| 2003/0033599 | A1 | 2/2003 | Rajaram et al. |
| 2003/0037075 | A1 | 2/2003 | Hannigan et al. |
| 2003/0055919 | A1 | 3/2003 | Fong et al. |
| 2003/0061384 | A1 | 3/2003 | Nakatani |
| 2003/0074658 | A1 | 4/2003 | Kim |
| 2003/0081786 | A1 | 5/2003 | Nakano et al. |
| 2003/0084435 | A1 | 5/2003 | Messer et al. |
| 2003/0093433 | A1 * | 5/2003 | Seaman et al. ................ 707/102 |
| 2003/0103484 | A1 | 6/2003 | Oommen et al. |
| 2003/0121032 | A1 | 6/2003 | Cho et al. |
| 2003/0154471 | A1 | 8/2003 | Teachman et al. |
| 2003/0162533 | A1 | 8/2003 | Moles et al. |
| 2003/0186689 | A1 | 10/2003 | Herle et al. |
| 2004/0015952 | A1 | 1/2004 | Lajoie et al. |
| 2004/0017831 | A1 | 1/2004 | Shen et al. |
| 2004/0031031 | A1 | 2/2004 | Rudelic |
| 2004/0034853 | A1 | 2/2004 | Gibbons et al. |
| 2004/0054995 | A1 | 3/2004 | Lee |
| 2004/0068724 | A1 | 4/2004 | Gardner et al. |
| 2004/0095457 | A1 | 5/2004 | Pokorny et al. |
| 2004/0111723 | A1 | 6/2004 | Moles et al. |
| 2004/0117785 | A1 | 6/2004 | Kincaid |
| 2004/0123282 | A1 | 6/2004 | Rao |
| 2004/0133887 | A1 | 7/2004 | Herle et al. |
| 2004/0152455 | A1 | 8/2004 | Herle |
| 2004/0166839 | A1 | 8/2004 | Okkonen et al. |
| 2004/0194081 | A1 | 9/2004 | Qumei et al. |
| 2004/0215755 | A1 | 10/2004 | O'Neill |
| 2004/0243992 | A1 | 12/2004 | Gustofson et al. |
| 2004/0243993 | A1 | 12/2004 | Okkonen et al. |
| 2004/0261072 | A1 | 12/2004 | Herle |
| 2004/0261073 | A1 | 12/2004 | Herle et al. |
| 2004/0267833 | A1 | 12/2004 | Meller et al. |
| 2005/0005268 | A1 | 1/2005 | Zilvay et al. |
| 2005/0039178 | A1 | 2/2005 | Marolia et al. |
| 2005/0060699 | A1 | 3/2005 | Kim et al. |
| 2005/0071385 | A1 | 3/2005 | Rao |
| 2005/0096025 | A1 | 5/2005 | Qumei et al. |
| 2005/0097544 | A1 | 5/2005 | Kim |
| 2005/0102615 | A1 | 5/2005 | Roman et al. |
| 2005/0114504 | A1 | 5/2005 | Marolia et al. |
| 2005/0144609 | A1 | 6/2005 | Rothman et al. |
| 2005/0144612 | A1 | 6/2005 | Wang et al. |
| 2005/0160195 | A1 | 7/2005 | Bruner et al. |
| 2005/0204068 | A1 | 9/2005 | Zhu et al. |
| 2005/0216902 | A1 | 9/2005 | Schafer |
| 2005/0216903 | A1 | 9/2005 | Schafer |
| 2005/0227683 | A1 | 10/2005 | Draluk et al. |
| 2006/0039561 | A1 | 2/2006 | Ypya et al. |
| 2006/0101040 | A1 | 5/2006 | Ren et al. |
| 2006/0174242 | A1 | 8/2006 | Zhu et al. |
| 2008/0016122 | A1 * | 1/2008 | Liu et al. ........................ 707/200 |
| 2009/0327343 | A1 * | 12/2009 | McCormack et al. ..... 707/104.1 |

OTHER PUBLICATIONS

Burns, et al, "In Place Reconstruction of Version Differences", Jul.-Aug. 2003, IEEE.

Computer Dictionary Microsoft Press third Edition, pp. 88, 190, 1997.

Final Office Action for U.S. Appl. No. 10/646,230 dated Nov. 10, 2010. pp. 18.

Fowler, et al; "Lossless Compression of Volumne Data", 1995, IEEE, pp. 43-50.

Non-Final Office Action for U.S. Appl. No. 10/646,230 dated Dec. 2, 2009. pp. 16.

Non-Final Office Action for U.S. Appl. No. 10/646,230, dated Jul. 23, 2007. pp. 15.

Non-Final Office Action for U.S. Appl. No. 10/646,230, dated Jun. 12, 2008. pp. 15.

Non-Final Office Action for U.S. Appl. No. 10/646,319, dated Nov. 20, 2006. pp. 9.

Non-Final Office Action for U.S. Appl. No. 11/923,383 dated May 13, 2011; pp. 23.

* cited by examiner

SYSTEM AND METHOD FOR EFFICIENT REMOTE DATA ACCESS FOR SERVER MANAGEMENT

CROSS REFERENCE TO RELATED APPLICATIONS

This application claims the benefit of U.S. Provisional Application Ser. No. 61/064060, filed Feb. 14, 2008, titled "System And Method For Efficient Remote Data Access For Server Management" which is hereby incorporated by reference herein as if reproduced in full bellow.

BACKGROUND

Modern servers contain both "system processors" and "service processors." Management of server hardware is commonly performed by a management application running on either a server or servers (e.g., in a blade or partitioned server system) being managed or on a remote management station (another computer). The management application obtains its data from the service processor(s) that is part of the server(s) being managed. The communication channel used to obtain this data typically has high latency and low bandwidth. Current protocols and formats used for this data transfer are, however, very inefficient over such a channel, leading to long application response times. Further, current methods require significant processing on the service processor for each data request, which also increases the latency due to the service processor's limited processing power.

When the amount of information to be transferred is small or the data rate is low, current methods can give acceptable performance. But the trend for server management applications is to request increasingly more information at higher rates; the point has been reached where current data transfer methods create a performance bottleneck that leads to unacceptable application performance. This is particularly a problem in large, partitionable servers and blade systems.

One current method for data access to a service processor is IPMI (Intelligent Platform Management Interface). IPMI uses a relatively efficient format for data transfer, but requires the application to perform schema accesses over the slow channel and requires the application to perform many accesses to obtain its required data. The processing of IPMI request on the service processor is relatively simple and efficient, but IPMI supports only a simple data model and a limited number of objects.

Another current method is WBEM (Web Based Enterprise Management). Originally designed to run on powerful computers and communicate over a fast data channel, it is being used on low performance service processors and slow communication channels. Besides having the schema access and multiple access limitations of IPMI, WBEM also uses a particularly inefficient data format and is complex, requiring significant memory and processing on the service processor to parse a request and form a response. WS-manage (Web Services for Management) is an emerging Microsoft method for obtaining management data with all of the disadvantages of WBEM.

SUMMARY

An advantage of the embodiments described herein is that they overcome the disadvantages of the prior art. These advantages and others are achieved by a system and method for efficient data access. A method for efficient remote data access for use by server management applications, includes transferring server schema from a service processor on a server to an application machine, receiving a request for server data on application machine, processing the request for server data on application machine, and forming, in a self-describing format, a single, consolidated query to obtain information not obtained from the server schema on the application machine. Processing the request obtains server data from the server schema on the application machine and the consolidated query is formatted in self-describing format. The method further includes transferring the consolidated query to the service processor, the service processor: processing the consolidated query, obtaining the requested data, and forming a response with the requested data in the self-describing format. The method transmits the formatted, retrieved data to application machine.

These advantages and others are also provided by a computer readable medium containing instructions for performing the above method. Likewise, these advantages and others are also provided by a system for efficient remote data access. The system includes an application machine including a memory that includes a remote server management application and instructions for executing the above method, a processor for executing the remote server management application and the instructions, a server including a service processor for receiving and processing queries from the application machine and a network connection between the application machine and the service processor, over which a copy of schema, consolidated queries, and retrieved data are transferred between application machine and server.

DESCRIPTION OF THE DRAWINGS

The detailed description will refer to the following drawings, wherein like numerals refer to like elements, and wherein.

DETAILED DESCRIPTION

Figure 1:
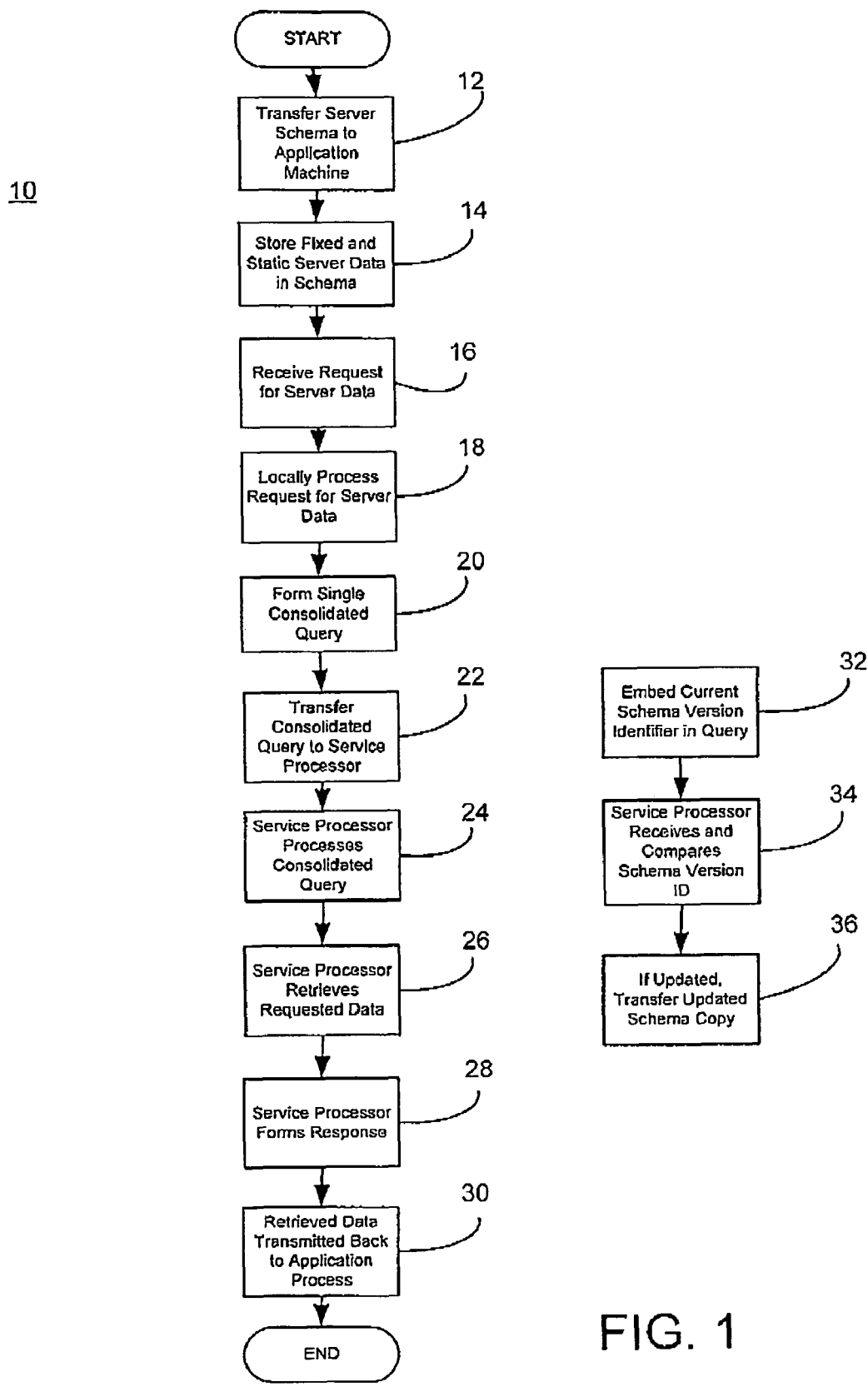
FIG. 1 is a flowchart illustrating an embodiment of a method for efficient remote data access.

Described herein are a system and method for efficient remote data access. The embodiments described herein provide efficient data access for remote server management applications. The performance of remote server management applications is significantly improved by these embodiments. Embodiments provide the efficient data access using a combination of software techniques.

As noted above, modern servers contain both "system processors" and "service processors." The system processors are powerful processors, e.g., Itanium and X86 processors, which have gigabytes of memory, are connected to large external data stores (disks) with terabytes (TBs) of storage, and have high-bandwidth network connections. Except for the smallest servers, there are multiple system processors in one server. The system processors run an operating system of an administrator's choice, e.g., Linux, Unix or Windows, and various applications such as a relational database (e.g., Oracle, SQL server) or enterprise ERP applications (e.g., SAP) or a high performance web or email server.

The service processor is an embedded microprocessor that controls the hardware the server comprises. Servers have more than just processors and memory; servers have bulk power supplies, dc-dc converters, fans and other more arcane components. The service processor is responsible for controlling these various hardware components. A couple of simple examples: servers have a network of temperature sensors that sense the air temperature at strategic locations in the server cabinet. The service processor monitors these sensors and controls the speeds of the fans to keep the temperatures within acceptable limits while running the fans as slowly as possible to keep noise and power consumption as low as possible. During power up and power down of the server, the multiple power supplies and power rails must be turned on and off in a strict sequence with strict timing—the service processor controls this activation of the power supplies and power rails and the sequence and timing of the activation.

The service processor typically has limited memory compared to the system processors (MB vs GB), is clocked at low frequencies (MHz vs GHz), has no external storage (versus the system processor's TB of external disks). The service processor runs a specialized embedded operating system. The service processor's programming is fixed in ROM at the server factory; unlike the system processors, the server administrator cannot alter the service processor's programming.

Although in small servers there is indeed typically just one service processor, in large partitioned servers and blade systems, the service processor may be a network of cooperating microprocessors. For example, in Hewlett Packards's ("HP's") current blade product, there is a service processor on each blade as well as a redundant pair in the server cabinet. In HP's current partitioned server family there is a service processor on each cell board and a redundant pair in the cabinet.

Service processor is a generic term; manufacturers have their own brand names for the service processors. HP cellular servers call them "the MP (Management Processor)" for the ones in the cabinet and "cell controller" for the ones on the cells. HP x86 servers call then "iLo (Integrated Lights Out)." HP blade servers call them "iLo" for the ones on the blades and "OA (Onboard Administrator)" for the ones in the cabinet. The IPMI specification uses the term "BMC (Baseboard Management Controller)."

Unlike the system processors, service processors are always on (assuming the server is plugged in), running on standby power. Service processors communicate with remote management applications via a network connection, but this network connection is typically a relatively low bandwidth connection compared to what the system processors have.

Server management applications both display information about the state of the server hardware and control the server hardware. To do this they communicate with the service processor, not with the system processors. After all, if a server administrator wants to remotely power up a server, the server management application cannot "talk" to a system processor since the system processor will be off. Likewise, if an administrator wants to know the temperatures in the server cabinet, the system management application must talk to the service processor because the system processor is not connected to the temp sensors.

Server management applications typically run on a server administrator's workstation in his office, well away from the computer room where the server(s) being managed resides. Modern workstations are far more powerful than the little embedded microprocessor that is the server's service processor.

Large modern servers are modular systems. Using an HP bladed system as an example, the blade chassis has slots for multiple bulk power supplies, slots for multiple fans, slots for multiple system processors and storage blades of various types in front and slots for multiple I/O blades of various types in back. The cabinet may be populated with an almost infinite combination of these components; not every slot needs to be filled. HP's partitioned servers are similar.

A typical function for a server management application is to display the inventory of the chassis (what's plugged in where). It is the service processor that knows this information, as well as detailed information about the components. Some examples of the detailed information about server hardware components the service processor can supply to a server management application are: the amount of memory a processor blade has installed, the number of system processors on a blade, the version of each system processor, the type of I/O card in each I/O slot, and so, on.

A server management application also typically displays hardware health and status information that it obtains from the service processor. Some examples: the power state (on or off) for each blade and bulk power supply, fan speeds, cabinet temperatures, power consumption, power rail voltage levels, and so on. If a component fails (e.g., a fan stops turning), the service processor can signal that to a server management application, too. The server management application can then be configured to alert an administrator (e.g., via e-mail or pager).

In bladed and partitioned servers, server management applications also configure the server. In bladed systems, a server management application remotely configures a blade in some slot to connect to one of the multiple networks connected to the blade chassis via an I/O switch blade. In a partitioned server, a management application configures processors and I/O cards into partitions (independent servers). All of this control is affected through the service processor.

The service processor needs to present an information rich interface to the server management application to accomplish all these tasks. This interface typically resembles a simple database interface. The server management application is making requests to the service processor such as: "What is the version number of processor 2 on blade 4?" or "Is there a fan in slot 5 and if so, what is its speed?" or "How much power is blade 6 consuming?" These sorts of requests to the service processor and the service processor's responses fit naturally into a database model. However, in this case the data is not written first by an application and then later retrieved but is real time information about the hardware state of the server.

Control over the hardware can also be achieved via this sort of database model using writes to object properties. So for example, one may have a "blade" entity that has a binary "power" property. If the server management application reads the power property for a blade it learns whether the blade is on or off. If the server management application writes the power property for a blade it turns the blade's power on or off.

For server management applications not to have to have embedded, a priori knowledge of the servers they manage, the service processor may also supply basic configuration information about the server. For example, HP has two different blade chassis, each of which has a different number of blade slots (among other things). Consequently, a server management application could be written with embedded knowledge of how many blade slots each chassis model has, and then the server management application could request of the service processor which model of chassis is its server. Alternatively, the server management application could be written to handle an arbitrary number of slots and ask the service processor how many slots the service processor's chassis has. For various reasons the later is more desirable.

The description of all the data the service processor can supply to a server management application, how the data is organized, what data may be read only and what data may be written and the format of each data item is the "schema." The schema is the information a server management application must have in order to know how to compose a request to the service processor. For example, a schema may say a server chassis has blade slots, blades have memory DIMMS, memory DIMMs have serial numbers, etc.

In current interfaces the schema resides on the service processor and the interface supports only simple requests. This means the server management application ends up making a long sequential string of requests to get information. For example, suppose a server management application wants to list the serial number of all the DIMMs in a server. A very much simplified version of the "conversation" with the service processor may be something like the following:

Step 1: First the server management application needs to see if the service processor can provide DIMM serial numbers and the path through the hardware decomposition to get them. The server management application sends a series of requests, somewhat akin to the following requests, receiving responses from the service processor for each (the actual conversation is much longer and more complex—the following is simplified to illustrate the concept of multiple requests and responses presently required to obtain the necessary information):

"What sort of server are you?"
"How many chassis are in this server?"
"Do the chassis have blades?"
"Do blades have DIMMS?"
"Do the DIMMs have serial numbers?"
"What's the format of a DIMM serial number?"

Step 2: Second, after it has received responses to the above, the server management application has to actually obtain the serial numbers. Consequently, the server management application sends a series of requests, somewhat akin to the following requests, receiving responses from the service processor for each (again, the actual conversation is much longer and more complex):

For each chassis, "How many blade slots does this chassis have?"
  For each slot, "Is there a blade in this slot?"
    For each slot that has a blade installed, "How many memory slots does this blade have?"
      For each memory slot, "is there a DIMM in this slot?"
        For each memory slot that has a DIMM installed, 'What is the serial number of this DIMM?'

As can be seen by the above illustration, there is considerable message traffic between the server management application and the service processor is required to implement even the simplest management function. The service processor in a big server can literally have tens of thousands of pieces of information about the server hardware, so it is easy to see that the communication path between the server management application and the service processor can be a performance bottleneck, especially if the latency is high (e.g., the administrator is operating a server management application running on a application machine in India to remotely managing a server in a US data center).

Embodiments of the system and method described herein overcome this performance bottleneck by:

A) Transferring the schema in total from the service processor to the server management application. This is typically done when the server management application first contacts the service processor on a server being managed. With the schema transferred, the first set of questions above can be answered without going to the service processor at all. Indeed, all schema queries by the server management application can be handled by the server management application process on the application machine. This eliminates the need to send a class of requests and responses over the slow channel between the server management application and the service processor and moves the bulk of the processing to the higher performance application machine.

B) Populating the transferred schema with not just the format and organization of the data but also hardware fixed data (e.g., this server has 8 blade slots) and relatively static population information (e.g., slot 5 has a blade installed, the blade in slot 5 has DIMMs in memory slots 0, 1, 2) that may be transferred to the server management application from the service processor. This eliminates the "How many" and "Is there one in this slot" questions in the second set of questions above from requiring traffic over the slow channel.

C) Provide a server management application interface that can handle a request for and supply multiple arbitrary data items at once. So, for example, instead of asking for each DIMM serial number in a single, separate request, the management application can form one request to get all the serial numbers at once in a single response: "Give me the DIMM serial numbers for blade 2 DIMMs 1,2,3, blade 3 DIMMs 1,2, blade 5 DIMMS 1,2,3,4" or "Give me the temperature sensor readings for the temperature sensors at blade 2, blade 3 and blade 5." In an embodiment, the server management application interface includes query code running on the application machine that allows the server management application to form a single query that retrieves all the information the server management application needs that it cannot obtain from the transferred schema and the data in the transferred schema. This further reduces the number of round trips over the slow channel and reduces the processing performed by the service processor.

D) Use an efficient, self-describing data format to transfer both the requests to the service processor and the responses back to the server management application. The efficient, self-describing data format reduces the number of bytes in a message over the slow channel and further reduces the processing performed by the service processor.

The four parts are independent of each other. Consequently, implementations may be created containing any combination of the four. However, if all four are implemented, then the server management application can, e.g., get all the DIMM serial numbers for the server with one request to the service processor. With the proper interface the processing required on the little weak microprocessor that is the service processor is minimal even for a request for a large amount of disparate information.

With reference now to FIG. 1, shown is an embodiment of method 10 for efficient remote data access that implements the above four concepts. Method 10 is used by remote server management applications, although other applications may utilize it as well. Indeed, instructions for performing method 10 may be incorporated into a server management application. As shown, method 10 transfers a schema, of a server, from service processor to the server management application, block 12. By transferring the schema to the server management application, the server management application process may obtain information about the server without making multiple requests to the service processor, as described above.

Servers can be changed or modified; for example, additional blades can be added to a bladed server. Accordingly, the server schema, which is the information about the server that the service processor can provide to the server management application, can change as well. Accordingly, a schema version identifier may be transferred with the schema. In this manner, the schema copy at the application machine can be checked versus the schema at the service processor and updated as needed.

With continuing reference to FIG. 1, method 10 populates the transferred schema with fixed and relatively static information about the server obtained from the service processor, block 14. By populating the schema on the application machine with this information, method 10 further reduces the amount of information that must be obtained from the service processor.

As noted above, the server management application will need to access a lot of server information to manage the server. Consequently, the server management application will generate numerous requests for data. In the prior art, these requests would each be transmitted to the service processor for processing as a series or class of requests and responses to and from the service processor. Each of theses requests and responses would need to be transmitted over the slow channel between the client machine and the server. Likewise, each request would have to be processed and each response generated by the service processor. In method 10, however, the server management application instead seeks to obtain as much data as possible from the transferred schema before contacting the service processor. Accordingly, the server management application process receives a request for server information, block 16, and processes the request locally on the application machine, block 18. The server management application process processes 18 the request locally by obtaining all of the relevant, responsive data available from the schema on the application machine. This, in affect answers the first set of questions illustrated in step 1 above and some of the second set of questions illustrated in step 2 above (e.g., "how many blade slots" and "is a blade in this slot").

With continuing reference to FIG. 1, after the server management application has received all of the information available locally from the transferred schema, additional information may need to be obtained from the service processor. However, rather than simply send a series of separate requests, the server management application process runs query code to form a single, consolidated query (the data request) to retrieve all the information the server management application needs, block 20. Specifically, the query code utilizes the schema to generate a single, consolidated query that will instruct the service processor to retrieve and return the requested data from the server. Because the schema on the application machine tells the query code how the data is organized and formatted in the service processor, the query code can form the consolidated query (e.g., "Give me the DIMM serial numbers for blade 2 DIMMs 1,2,3, blade 3 DIMMs 1,2, blade 5 DIMMS 1,2,3,4").

The consolidated query is formatted in an easily parsable format. The format is preferably an efficient, self-describing data format. Looking at how the consolidated query may be encoded to send to the service processor gives a notion of the self-describing format. Self-describing is a term of art in computer science that generally has to do with tagging data so that one does not have to have a priori knowledge of context or format to know what a value means. So a sequence of bytes '123456789' might mean anything; it is only when it is known that this is a string, not an integer or floating point number (its format or syntax) and is a serial number (its semantic) and is the serial number of DIMM 2 on Blade 1 (its instance) that this sequence of bytes has meaning. The idea behind a self-describing format is to pack the most information into the smallest number of bytes possible.

Continuing this example, a request for the serial number DIMM 1 on blade 2 may be encoded as the tuple: <B, 2, D, 1, N>; where B means blade, 2 is the blade number (i.e., the slot number the blade is in), D means DIMM, 1 is the DIMM number and N means serial number. The English decoding of this request tuple is then "Give me the serial number for the DIMM in memory slot 1 of the blade in blade slot 2." By sending a simple sequence of tuples such as these as a request, method 10 can provide a consolidated request for a list of any set of information the service processor can supply. For example, a sequence to get the serial numbers for blade 2 DIMMs 1,2,3, blade 3 DIMMs 1,2, blade 5 DIMMS 1,2,3,4 from the above example would be:

<B, 2, D, 1, N><B, 2, D, 2, N><B, 2, D, 3, N><B, 3, D, 1, N><B, 3, D, 2, N><B, 5, D, 1, N><B, 5, D, 2, N><B, 5, D, 3, N><B, 5 D, 4, N>

The response from the service processor might be the tuple <B, 2, D, 1, N, S10, 1234567890>, i.e., blade 2, DIMM 1, serial number, a string of 10 characters whose value is "1234567890." The data is self-describing, in that it contains its description as well as its value.

There are many of different schemes for encoding self-describing data. The one outlined above is both simple and flexible. Other embodiments could make it more complex and more compact. But since there is a shared schema between the server management application and the service processor, an embodiment can go so far as to assign each individual data item (e.g., each individual DIMM serial number) a unique identifier (aka, GUID, Globally Unique IDentifier). Then all the server management application and the service processor would have to do is transfer the GUIDs in a request and the GUIDs and values in a response. Note: the above is talking implicitly about read requests to the service processor; write requests would be similar but also contain the data values to be written, of course.

Efficiency can be increased by eliminating all descriptive information in a read response if sequence is preserved. Since the server management application has the schema, it knows a DIMM serial number is a fixed length string of 10 characters (that sort of information is in the schema), and it can know the sequence of the serial numbers it requested (e.g., first is blade 2, DIMM 1, next is blade 2 DIMM 2, and so on), then the service processor could just return the serial number strings in the sequence they were requested; the server management application then remembers the sequence of the request and matches up the returned values to their meanings.

With continued reference to FIG. 1, the format of a data item is fixed in the firmware of the service processor and is described to the server management application in the schema. So, when the server management application receives 16 and locally processes 18 a request for data, it reads the schema to discover that, for example, a DIMM serial number is a fixed length string of 10 characters or that a blade slot number is a single byte unsigned integer in the range 0 to 7, or that fan speed is a 32 bit floating point number in units of RPM. With this information, the server management application can form 20 a consolidated query. It is common practice to write server management applications that have to access arbitrary data to be able to handle arbitrary formats and to look up the format for data items in a schema of some sort.

For example, HP servers have many different of serial numbers for their various components and they do not all have the same format (for many very practical reasons). So, although a DIMM serial number may be 10 characters on an Itanium partitioned server, it might be 12 characters on a blade server. An I/O card serial number might be 8 characters. An IBM server might have 24 character DIMM serial numbers. To keep the server management applications flexible so they do not have to be rewritten every time a new server is introduced, they are written to handle arbitrary data and look up the formats of that data at the time it is being used.

With continued reference to FIG. 1, using the self-describing format reduces the number of bytes needed for the consolidated query, reducing bandwidth requirements and the number of bytes sent over the slow channel between the client machine and the server. Likewise, the self-describing format enables the service processor to more easily and quickly process the consolidated query. Optionally, the efficiency of the request transfer (the transfer of the single, consolidated query) may be increased by using any one of several well known data compression algorithms to compress the single, consolidated query. While decreasing the transfer time, using a data compression algorithm requires a decompression step be performed by the service processor, therefore adding the cost of increased processing on the server.

With continuing reference to FIG. 1, after the single, consolidated query is formed 20, method 10 transfers the single, consolidated query formatted in the self-describing data format to the service processor, block 22. In effect, the server management application process receiving 16 and processing 18 the query, forming 20 a single, consolidated query and transferring the single, consolidated query 22 replaces almost all of the multiple request and response transmissions between the server management application and the server processor. Method 10, therefore, reduces the number of round trips over the slow channel between the client machine and the server and reduces the necessary processing performed by the service processor. As a result, accessing data from the remote server is streamlined.

Upon receipt of the single, consolidated query, the service processor processes the consolidated query, block 24. As noted above, using the self-describing format reduces the processing that is performed by the slow service processor. In processing 24 the consolidated query, the service processor extracts the location and information necessary to retrieve the requested data. Accordingly, the service processor retrieves the requested data, block 26.

With continued reference to FIG. 1, in the embodiment shown, the same self-describing format used for the consolidated query is also used for the result of transmitted back to the application process by the server processor. Consequently, service processor forms the response in the self-describing format, block 28. Optionally, as noted above, the formatted data may also be compressed according to any one of several well known data compression algorithms. While this increases the processing required by the service processor, it increases the efficiency of the response transfer to the application process. As a single response to the query, the requested data, formatted in the self-describing format and optionally compressed, is transmitted back to the application process, block 30. Method 10 may repeat steps 14-30 multiple times as needed during the running of the server management application.

Additionally, in an embodiment, a schema version identifier is embedded in the data request (the formatted, consolidated query), block 32. The embedded schema version identifier may be the identifier described above that is transferred with the schema in 12. Consequently, the service processor may receive and compare the embedded schema version identifier the current version of the server schema, block 34. If the server schema has been changed and updated, the service processor may transfer a copy of the updated schema, along with a new schema version identifier as the response, block 36. In this manner, server schema changes may be detected, the schema on the application machine updated, and data requests reformed using the updated schema and re-sent to the service processor (e.g., steps 18-24 repeated).

The method described herein allows an application to obtain all the data it needs from the service processor in a single request/response pair from the service processor plus the overhead of one schema transfer over the slow channel, as opposed to the overhead of multiple request/response pairs and significant processing by the service processor previously required. Indeed, existing solutions require many requests and responses (typically hundreds of request/response pairs in a mid-range partitioned server). Since the slow channel is the performance bottleneck, this solution can provide up to orders of magnitude increases in performance.

The efficient data transfer format of this method further increases performance. WBEM, for example, can quite literally require the transfer of megabytes over the slow channel to obtain kilobytes of information; its data transfer format is that inefficient. The method described herein reduces the processing required on the service processor to a minimum, consequently simplifying embedded firmware and reducing the processing required on the low capability service processor, further improving performance. The method described herein supports complex data and complex data organization. The method described herein can be implemented to preserve the data models and APIs of existing management methods such as WBEM and WS-manage, consequently providing a large performance boost to management applications simply by re-linking the application to a new access library. The method described herein may also be implemented as a new API and access standard, providing an architectural control point in the industry. Moreover, the method described herein is applicable not just for server management data, but for a general class of data access over a slow channels.

Figure 2:
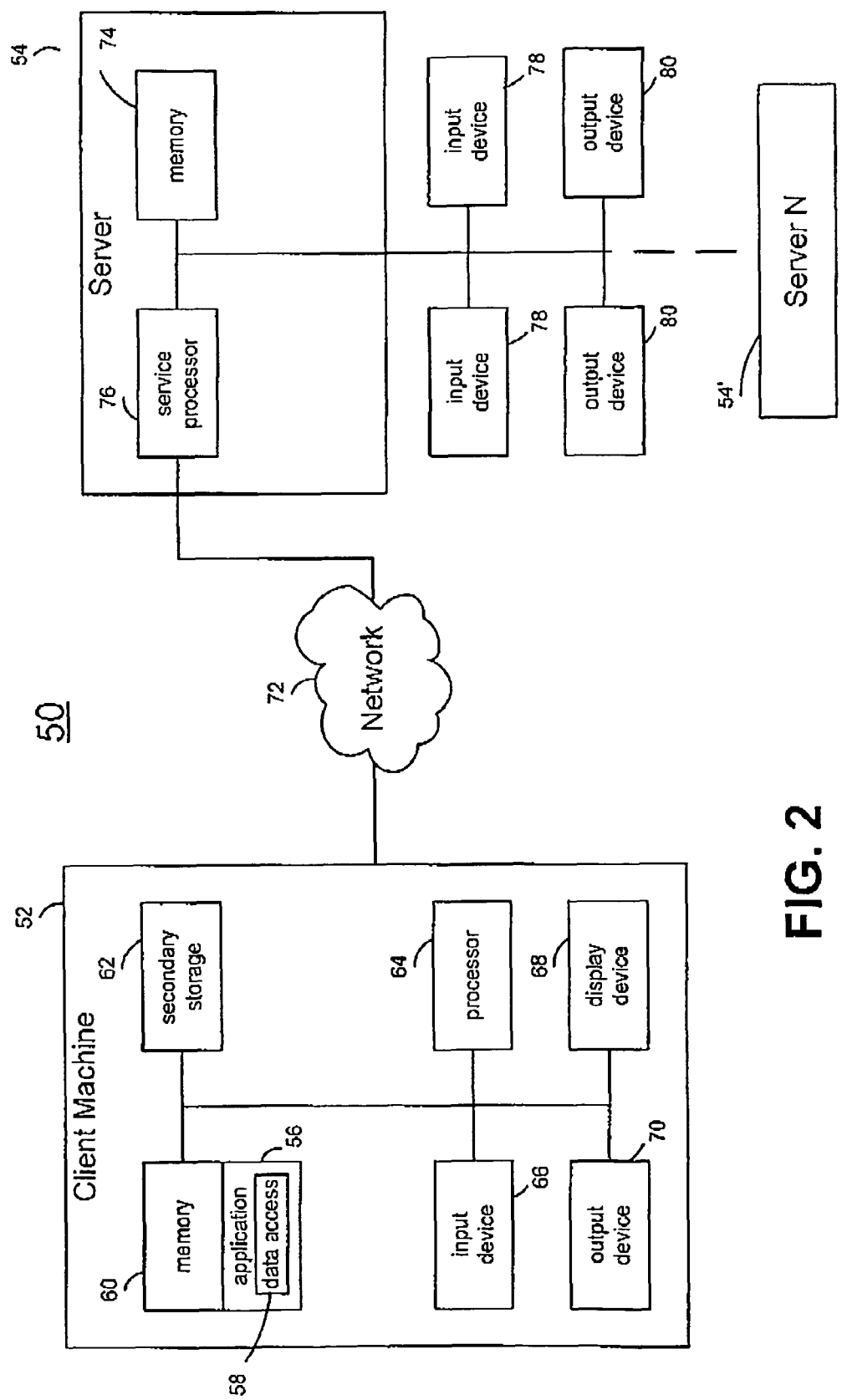
FIG. 2 is a block diagram illustrating exemplary hardware for implementing an embodiment of a system and method for efficient remote data access.

With reference now to FIG. 2, shown is a block diagram illustrating an embodiment of system 50 for efficient remote data access. System 50 preferably includes application machine 52 and server 54. Instructions for performing method 10 are embodied on computer-readable media. As noted above, such instructions may be incorporated as part of server management application or as a separate, stand-alone application that server management application 56 interacts with and to which server management application sends data requests. Application machine 52 may host remote server management application 56 in which data access instructions 58 for performing method 10 are embodied. Alternatively, data access instructions 58 may be a separate application.

Application machine 52 illustrates typical components of a computer on which server management application 56 is run. Application machine 52 typically includes a memory 60, a secondary storage device 62, a processor 64, an input device 66, a display device 68, and an output device 70. Memory 60 may include random access memory (RAM) or similar types of memory, and it may store one or more applications during execution, including remote server management application 56 and data access instructions 58, for execution by processor 64. Memory 60 may also store a copy of the server database schema while application 56 is running. Secondary storage device 62 may include a hard disk drive, floppy disk drive, CD-ROM drive, or other types of non-volatile data storage, and it may store application 56, data access instructions 58 and copy of the server database schema. Processor 64 may execute applications or programs stored in memory 60 or secondary storage 62, or received from the network 72 (e.g., Internet, LAN, etc.), and the processing may be implemented in software, such as software modules, for execution by computers or other machines. As noted above, remote server management application 56 and data access instructions 58 preferably include instructions executable to perform the methods described above with reference to FIG. 1. Input device 66 may include any device for entering information into machine 52, such as a keyboard, mouse, cursor-control device, touch-screen, microphone, digital camera, video recorder or camcorder. Display device 68 may include any type of device for presenting visual information such as, for example, a computer monitor or flat-screen display. The display device 68 may display GUIs for an administrator to operate and access the server management application. Output device 70 may include any type of device for presenting a hard copy of information, such as a printer, and other types of output devices including speakers or any device for providing information in audio form. As noted above, client machine 52 is typically a high-performance computer with sufficient memory and processor speeds to perform method 10 efficiently and quickly.

Application machine 52 typically connects to service processor on server 54 through network 72. As discussed above, network 72 is typically a low latency connection, at least relative to the size and number of data requests and responses typically required by server management applications in the prior art. System 50 and method 10 overcome this limitation as described above.

A server, such as server 54, of course has many more components then those illustrated in FIG. 2. For example, as described above server 54 typically includes a plurality of powerful system processors (not shown), e.g., Itanium and X86 processors, which have gigabytes of memory (not shown), are connected to large external data stores (disks) with terabytes (TBs) of storage (not shown), and have high-bandwidth network connections (not shown). Except for the smallest servers, there are multiple system processors in one server. The system processors run an operating system of an administrator's choice, e.g., Linux, Unix or Windows, and various applications such as a relational database (e.g., Oracle, SQL server) or enterprise ERP applications (e.g., SAP) or a high performance web or email server.

Server 54 shown only illustrates some of the components associated with a service processor. These components typically include a memory 74, the service processor 76, input devices 78 and output devices 80. Memory 74 is typically ROM and RAM or similar types of memory and it may store specialized embedded operating system and other programming fixed for execution by service processor 78. Input devices 78 may typically include sensors, such as temperature sensors, power usage sensors, etc. Output devices 80 may include various controls, switches, etc., whereby the service processor 76 controls aspects of the server 54 (e.g., turns on fans, system processors, etc.). Some service processors also have human interaction input devices 78 and output devices 80. For example, the OA (Onboard Administrator) that is the cabinet level service processor in HP's blade chassis has a small display (about the size of a palm device) and a little keypad with navigation keys (up, down, left, right, enter, etc).

Service processor 76 stores the server schema as described above. Service processor 76 retrieves requested data and performs actions as instructed by server management applications 56.

Multiple servers 54' are shown to illustrate a blade or partitioned server system. In addition, although application machine 52 and server 54 are depicted with various components, one skilled in the art will appreciate that these machines and the server can contain additional or different components. As noted above, server 54 only illustrates components associated with the service processor. In addition, although aspects of an implementation consistent with the above are described as being stored in memory, one skilled in the art will appreciate that these aspects can also be stored on or read from other types of computer program products or computer-readable media, such as secondary storage devices, including hard disks, floppy disks, or CD-ROM; a carrier wave from the Internet or other network; or other forms of RAM or ROM. The computer-readable media may include instructions for controlling a computer system, such as application machine 52, to perform a particular method, such as method 10.

It is also noted that server management applications may also run on the system processor of the server being managed. This used to be common for some server management applications on HP's partitioned servers. The management application would present a remote GUI to the administrator sitting at his workstation (via a web browser, for example). The server management application running on the system processor communicates with the service processor via either an internal, special communication path in the hardware, or out the system processor's network interface to the service processors network interface. The embodiments described herein may be implemented in such a configuration.

It is further noted that a server management application may obtain information not only from a service processor on a server, but also from the server's system processors. For example, if the management application wishes to display the amount of free external storage, the amount of main memory allocated by the operating system to each application or the percentage of system CPU time each application is consuming it obtains this information from a system processor, not the service processor. The embodiments described herein may also be used to advantage for these data accesses.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

The invention claimed is:

1. A method for efficient data access for use by server management applications, comprising:
    receiving, at an application machine, a schema from a service processor, wherein the schema includes a description of data the service processor can supply, how the data is organized, what data is read only and what data may be written, and a format of each data item;
    receiving a request for server data at the application machine;
    processing the request for server data on the application machine, wherein processing the request obtains data from the schema on the application machine;
    the application machine forming, in a self-describing format, a consolidated query using the schema to obtain information not in the schema;
    sending the consolidated query to the service processor; and
    receiving an updated schema at the application machine, where the updated schema was updated by the service processor in response to information in the consolidated query indicating that a version of the schema at the application machine is not up-to-date.

2. The method of claim 1, wherein sending the consolidated query to the service processor causes the service processor to:
    process the consolidated query;
    obtain data requested by the consolidated query; and
    form a response with the obtained data in the self-describing format.

3. The method of claim 2 further comprising receiving, by the application machine, the obtained data transmitted by the service processor.

4. The method of claim 1 wherein receiving the schema comprises receiving a schema identifier at the application machine.

5. The method of claim 4 further comprising:
embedding the schema identifier into the consolidated query;
wherein the updated schema was updated by the service processor in response to the embedded schema identifier indicating that a version of the schema at the application machine is not up-to-date.

6. The method of claim 5 further comprising re-forming the consolidated query using the updated schema.

7. The method of claim 1, wherein the receiving the request, processing the request, and forming the consolidated query are performed by a remote server management application at the application machine.

8. The method of claim 1, further comprising storing static and fixed data from the service processor in the schema at the application machine.

9. A non-transitory computer readable storage medium storing instructions that upon execution cause an application machine to:
receive a schema from a service processor on a server,
wherein the schema includes a description of data the service processor can supply to a server management application, how the data is organized, what data is read only and what data may be written, and a format of each data item;
receive a request for server data;
process the request for server data, wherein processing the request obtains data from the schema on the application machine;
form, in a self-describing format, a consolidated query using the schema to obtain information not obtained from the schema on the application machine: send the consolidated query to the service processor; and
receive an updated schema, where the updated schema was updated by the service processor in response to information in the consolidated query indicating that a version of the schema at the application machine is not up-to-date.

10. The computer readable storage medium of claim 9, wherein sending the consolidated query causes the service processor to:
process the consolidated query;
obtain data requested by the consolidated query; and
form a response with the obtained data in the self-describing format.

11. The computer readable storage medium of claim 10, wherein the instructions upon execution cause the application machine to receive the obtained data.

12. The computer readable storage medium of claim 9, wherein the instructions upon execution cause the application machine to store static and fixed data from the service processor in the schema at the application machine.

13. The computer readable storage medium of claim 9, wherein the information in the consolidated query includes a schema identifier embedded in the consolidated query.

14. A non-transitory computer readable storage medium storing instructions that upon execution cause an application machine to: receive a schema and a schema identifier from a service processor on a server, wherein the schema includes a description of data the service processor can supply to a server management application, how the data is organized, what data is read only and what data may be written, and a format of each data item;
receive a request for server data;
process the request for server data, wherein processing the request obtains data from the server schema on the application machine;
form, in a self-describing format, a consolidated query using the schema to obtain information not obtained from the schema on the application machine, wherein the schema identifier is embedded into the consolidated query;
send the consolidated query to the service processor; and
receive an updated schema at the application machine, where the updated schema was updated by the service processor in response to the embedded schema identifier indicating that a version of the schema at the application machine is not up-to-date.

15. The computer readable storage medium of claim 14 further comprising instructions for re-forming the consolidated query using the updated schema.

16. A server comprising:
a service processor; and
a memory to store a schema that includes a description of data the service processor is able to supply to a server management application at an application machine, how the data is organized, what data is read only and what data may be written, and a format of each data item in the data,
wherein the service processor is configured to:
send the schema to the application machine over a network,
receive a consolidated query formed by the application machine using the sent schema, wherein the consolidated query is formed by the application machine in response to a request for server data received at the application machine, and the consolidated query is to obtain information not found in the sent schema,
send requested data to the application machine in response to the consolidated query;
determine whether the schema at the application machine is up-to-date based on information in the consolidated query, and
send an updated schema to the application machine in response to determining that the schema at the application machine is not up-to-date.

17. The server of claim 16, wherein the service processor is configured to further:
retrieve a schema identifier included in the consolidated query, wherein the information in the consolidated query includes the schema identifier,
wherein determining whether the schema at the application machine is up-to-date is based on the schema identifier.

* * * * *

UNITED STATES PATENT AND TRADEMARK OFFICE
CERTIFICATE OF CORRECTION

PATENT NO. : 8,219,595 B2
APPLICATION NO. : 12/234764
DATED : July 10, 2012
INVENTOR(S) : Gerald J. Kaufman, Jr.

It is certified that error appears in the above-identified patent and that said Letters Patent is hereby corrected as shown below:

In the Claims:

In column 13, line 38, in Claim 9, delete "machine:" and insert -- machine; --, therefor.

In column 14, line 11, in Claim 14, before "schema" delete "server".

Signed and Sealed this
Fourteenth Day of May, 2013

Teresa Stanek Rea
*Acting Director of the United States Patent and Trademark Office*